United States Patent
Mine

(10) Patent No.: US 6,965,531 B2
(45) Date of Patent: Nov. 15, 2005

(54) SEMICONDUCTOR MEMORY DEVICE HAVING A REFERENCE CELL

(75) Inventor: Koji Mine, Tokyo (JP)

(73) Assignee: Elpida Memory, Inc. (JP)

( * ) Notice: Subject to any disclaimer, the term of this patent is extended or adjusted under 35 U.S.C. 154(b) by 0 days.

(21) Appl. No.: 10/462,410

(22) Filed: Jun. 16, 2003

(65) Prior Publication Data

US 2003/0231525 A1 Dec. 18, 2003

(30) Foreign Application Priority Data

Jun. 17, 2002 (JP) ........................................ 2002-175961

(51) Int. Cl.$^7$ ................................................. G11C 7/00
(52) U.S. Cl. .................. 365/189.07; 365/149; 365/205; 365/230.03
(58) Field of Search .......................... 365/189.07, 149, 365/205, 230.03

(56) References Cited

U.S. PATENT DOCUMENTS

| | | | | |
|---|---|---|---|---|
| 5,828,615 A | * | 10/1998 | Mukunoki et al. ........... | 365/210 |
| 5,856,938 A | * | 1/1999 | Kasai et al. ................. | 365/149 |
| 5,892,724 A | * | 4/1999 | Hasegawa et al. ...... | 365/230.03 |
| 6,151,244 A | * | 11/2000 | Fujino et al. ................ | 365/149 |
| 6,230,292 B1 | * | 5/2001 | Duesman et al. ........... | 714/718 |
| 6,295,241 B1 | * | 9/2001 | Watanabe et al. ........... | 365/208 |

* cited by examiner

*Primary Examiner*—Hoai Ho
(74) *Attorney, Agent, or Firm*—Hayes Soloway P.C.

(57) ABSTRACT

An open-bit semiconductor memory device includes a plurality of memory cell arrays, wherein half of the memory cells in the memory cell array and half of the memory cells in the adjacent memory cell array store therein complementary data. The memory device further includes a pair of reference cell arrays sandwiching therebetween the memory cell arrays for supplying reference data for reading data from the memory cells in the adjacent memory cells. The reference cell array includes a plurality reference bit lines each connected to reference cells in number smaller than the number of memory cells connected to the bit line, and yet has a resistance and a capacitance equivalent to the resistance and the capacitance of the bit lines.

13 Claims, 10 Drawing Sheets

SEMICONDUCTOR MEMORY DEVICE HAVING A REFERENCE CELL

BACKGROUND OF THE INVENTION

1. (a) Field of the Invention

The present invention relates to a semiconductor memory device having a reference cell and, more particularly, to a semiconductor memory device suited for improving an open-bit semiconductor memory device.

2. (b) Description of the Related Art

An open-bit semiconductor memory device includes a sense amplifier which amplifies a potential difference between a pair of complementary bit lines disposed in different memory cell arrays in a read operation. FIG. 9 shows a conventional open-bit semiconductor device, which includes a plurality (k+1) of memory cell arrays 11 including zero-th to k-th memory cell arrays consecutively arranged from the left toward right in the drawing, a plurality (k) of sense amplifier arrays 13 each disposed between adjacent two of the memory cell arrays 11.

Each memory cell array 11 includes a plurality (2×(m+1)) of bit lines BL (BLT or BLN) extending in the column direction, and a plurality (n+1) of word lines WL extending in the row direction. Memory cells 21 are disposed in number 2×(m+1)×(n+1) at respective intersections of the bit lines BL and the word lines WL. Each memory cell 21 includes a single transistor and an associated single capacitor.

Each sense amplifier array 13 disposed between adjacent two of the memory cell arrays 11 includes sense amplifiers 24 in number (m+1). Each sense amplifier 24 receives a signal from a bit line BLN of one of the adjacent two of the memory cell arrays and a signal from a bit line BLT of the other of the adjacent two of the memory cell arrays, amplifies the potential differences between the bit lines BLN and BLT, and sets one of the bit lines BLN and BLT having a higher potential at a high level and the other of the bit lines having a lower potential at a low level.

FIG. 10 shows a timing chart of the memory device of FIG. 9 during a read operation. It is assumed in the following description that the sense amplifiers 24 in the 1st sense amplifier array 13 reads the data delivered from a memory cell in the 1st memory cell array 11, which is disposed next to the leftmost (zero-th) memory cell array 11.

In the read operation of the semiconductor memory device, a high level of a transfer control signal TG is input to the gates of transfer gate transistors (not shown), thereby connecting the sense amplifiers 24 to respective bit lines BLT of the zero-th memory cell array 11 and respective bit lines BLN of the 1st memory cell array 11, which are subjected to equalizing for balancing of the voltages at a bit-line balancing voltage VHVD.

To read the data, a word line for the selected memory cell is activated to a high level (VPP level) in the 1st memory cell array 11, whereby memory cells 21 connected to the bit lines BLN are selected in the 1st memory cell array 11. At the same time, a word line WL of the zero-th memory cell array connected to the memory cells having data complementary with the data stored in the memory cells in the 1st memory cell array 11 are also activated at the VPP level, whereby the memory cells 21 connected to the bit lines BLT in the zero-th memory cell array 11 are also selected.

After the word lines WL are activated, the data stored in the corresponding memory cells 21 are delivered to the bit lines BLT in the zero-th memory cell array 11 and to the bit lines BLN in the 1st memory cell array 11. Since these delivered data are complementary data as described above, the bit lines BLT and the corresponding bit lines BLN have respective potential differences therebetween due to the read data.

Subsequently, a sense-amplifier activating signal SE is activated to a peripheral-circuit source voltage VPERI, and thus the sense amplifiers 24 in the 1st sense amplifier array 13 start for operation. These sense amplifiers 24 amplify the respective potential differences between the bit lines BLN in the 1st memory cell array 11 and the bit lines BLT in the zero-th memory cell array 11, setting the bit lines having higher potentials at a high level (VDL level) and the bit lines having lower potentials at a low level (GND level).

After the potential differences between the bit lines are amplified, the data corresponding to the respective levels are stored again in the memory cells 21 in the 1st and zero-th memory cell arrays 11. Subsequently, the selected word lines WL are inactivated, whereby the memory cells 21 in the 1st and zero-th memory cell arrays 11 are disconnected from the respective bit lines BLN and BLT. The sense-amplifier activating signal SE is then inactivated to a low level, stopping the read operation by the sense amplifier 24 and then balancing the bit lines BLT and BLN to the bit-line balancing voltage VHVD.

As described above, upon a read operation for reading data is from a selected memory cell connected to a bit line BLN in a memory cell array, the sense amplifier uses data stored in another memory cell connected to a bit line BLT in the adjacent memory cell array as a reference data. Similarly, upon a read operation for reading data from a selected memory cell connected to a bit line BLT, the sense amplifier uses data stored in another memory cell connected to a bit line BLN as a reference data.

The use of a pair of bit lines BLN and BLT having similar line resistance and similar line capacitance and precharged to the same potential allows the sense amplifier to read the data substantially without the influence of noise. The use of data in the reference memory cell having the data complementary with the data of the selected memory cell increases the noise margin in the differential potential to improve the read accuracy.

It is to be noted that the sense amplifiers 24 are disposed for every other bit lines BLT or BLN in the adjacent two memory cell arrays 11, and thus the zero-th memory cell array 11 and the k-th memory cell array 11 include memory cells 21 which are not connected to the sense amplifiers 24. These memory cells 21 are shown by dots in FIG. 9 and the number of these memory cells 21 corresponds to half the memory cells in each memory cell array 11, which incurs waste of resources.

In addition, if the zero-th and k-th memory cell arrays 11 are to be used only as reference cell arrays, all the memory cells in these reference cell arrays never contribute the data storage. Thus, it is desired to reduce the scale of the reference cell arrays to thereby reduce the occupied area of the semiconductor memory device as a whole. In this case, although the memory cells shown by dots in the zero-th and k-th memory cell arrays may be omitted, any of the other memory cells cannot be omitted in the reference cell arrays because both the bit lines BLT and BLN connected to the sense amplifier should have the same length and the same number of memory cells connected thereto in view of an accurate read operation.

SUMMARY OF THE INVENTION

In view of the above, it is an object of the present invention to provide a semiconductor memory device, which is capable of reducing the number of memory cells used as the reference cells substantially without affecting the read accuracy of the sense amplifier.

The present invention provides a semiconductor memory device including: a plurality of memory cells; a plurality of bit lines each connected to a specified number (n) of the memory cells; a plurality of reference bit lines each corresponding to one of the bit lines and connected to a specified number (m) of reference cells to have a line resistance and a line capacitance equivalent to a line resistance and a line capacitance, respectively, of a corresponding bit line, where n>m; a precharge circuit for supplying a balancing voltage to the bit lines and the respective reference bit lines; a plurality of sense amplifiers each for amplifying a potential difference between one of the bit lines and a corresponding reference bit line.

The present invention also provides a semiconductor memory device including: a plurality of first memory cell arrays each including a plurality of first memory cells arranged in a matrix, a plurality of first bit lines each extending in a column direction and connected to a column of the first memory cells, and a plurality of first word lines each extending in a row direction and connected to the first memory cells; a plurality of second memory cell arrays arranged alternately with the first memory cell arrays in the column direction, each of the second memory cell arrays including second memory cells arranged in a matrix in number corresponding to a number of the first memory cells, a plurality of second bit lines each extending in the column direction and connected to a column of the second memory cells, a plurality of second word lines each extending in the row direction and connected to the second memory cells, half of the first memory cells in one of the first memory cell arrays and a corresponding half of the second memory cells in an adjacent one of the second memory cell arrays storing therein complementary data; at least one reference cell array disposed outside the first and second memory cell arrays and including a plurality of reference bit lines corresponding to either the first bit lines or second bit lines, each of the reference bit lines being connected to a specified number of reference cells, the specified number being smaller than a number of the memory cells arranged in the column of the first or second memory cells; a precharge circuit for supplying a balancing voltage to the first or second bit lines and the corresponding reference bit lines; a plurality of sense amplifier arrays each disposed between one of the first memory cell arrays and a corresponding one of the second memory cell arrays, or between one of the first and second memory cell arrays and the reference cell array, each of the sense amplifier arrays including sense amplifiers in number corresponding to half the number of the first bit lines in one of the first memory cell arrays, each of the sense amplifiers amplifying a potential differences between one of the first bit lines and a corresponding one of the second bit lines having complementary data thereon or between one of the first and second bit lines and one of the reference bit lines.

In accordance with the semiconductor memory device of the present invention, since the reference cell array includes a less number of reference cells connected to each reference bit line compared to the number of memory cells connected to the bit line, the reference cell array has a smaller occupied area than the memory cell arrays used as the reference cell arrays in the conventional technique. Thus, the semiconductor memory device of the present invention can be fabricated with a smaller occupied area.

The above and other objects, features and advantages of the present invention will be more apparent from the following description, referring to the accompanying drawings.

PREFERRED EMBODIMENTS OF THE INVENTION

Figure 1:
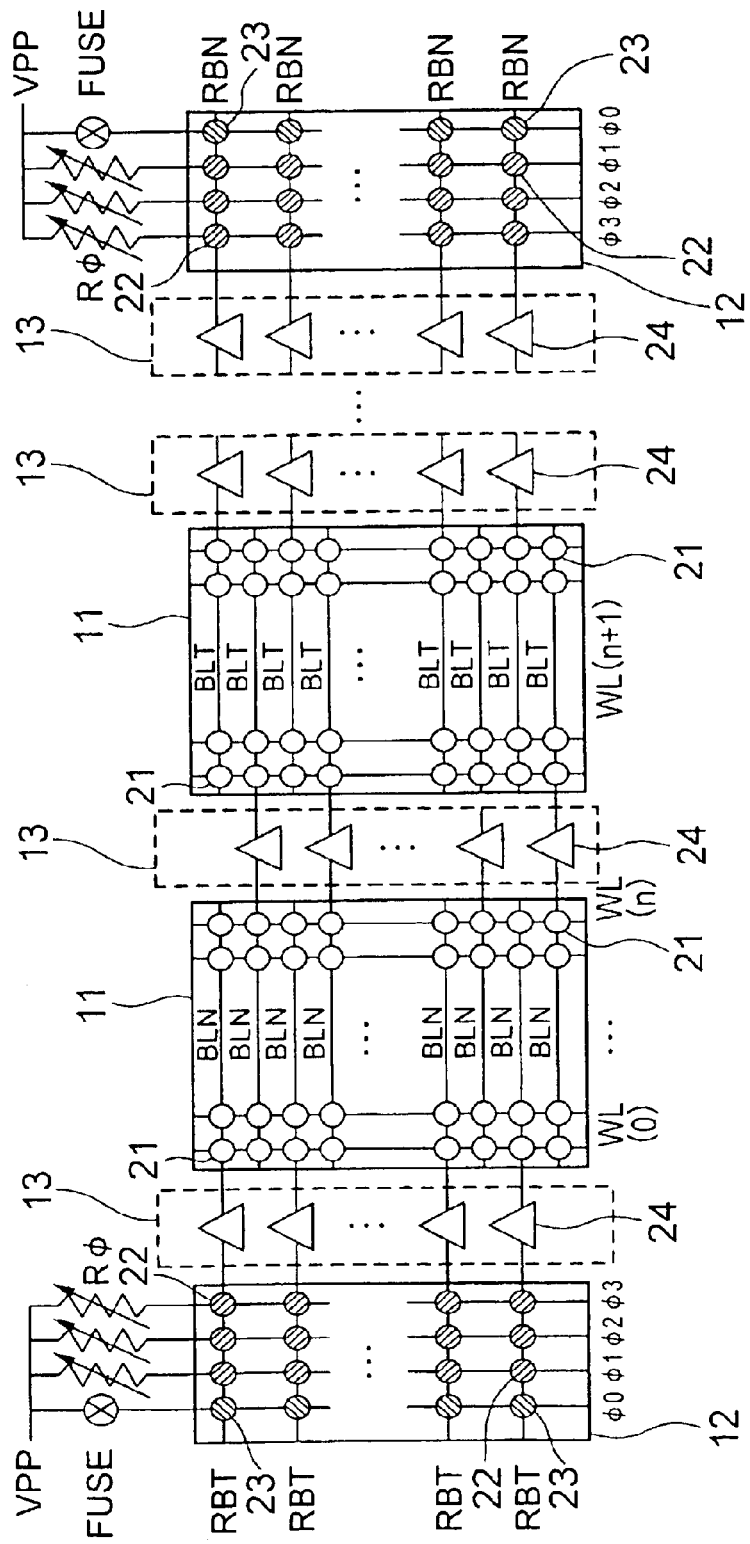
FIG. 1 is a block diagram of an open-bit semiconductor memory device according to a first embodiment of the present invention.

Now, the present invention is more specifically described with reference to accompanying drawings, wherein similar constituent elements are designated by similar reference numerals throughout the drawings.

Referring to FIG. 1, an open-bit semiconductor memory device according to a first embodiment of the present invention includes (k−1) memory cell arrays including 1st to (k−1)-th cell arrays 11 arranged from the left toward the right, first and second reference cell arrays 12 disposed at the leftmost end and rightmost end, respectively, of the memory device, and k sense amplifier arrays 13 including 1st to k-th sense amplifier arrays 13.

Each of 1st to k-th memory cell arrays 11 includes therein 2×(m+1) bit lines BL, and (n+1) word lines WL. Each of the odd-numbered memory cell arrays 11 includes bit lines BLN whereas each of the even-numbered memory cell arrays includes bit lines BLT. Each memory cell array 11 includes 2×(n+1)×(m+1) memory cells disposed at the respective intersections between the lines BL and the word lines WL.

Each of the odd-numbered bit lines (or even-numbered bit lines) BL in each memory cell array 11 is connected to a sense amplifier 24, to which a corresponding even-numbered bit line (or odd-numbered bit line) BL in an adjacent memory cell array 11 or a corresponding reference bit line RB in the reference cell array 12 is connected. The data stored in a memory cell (first memory cell) of a memory cell array 11 is complementary with the data stored in a second memory cell, which is disposed in an adjacent memory cell, accessed and sensed by a common sense amplifier at the same time with the first memory cell during a read operation.

The first and second reference cell arrays 12 are disposed as a zero-th memory cell array and a k-th memory cell array, respectively. The first reference cell array 12 includes (m+1) reference bit lines RBT, and (p+1) adjustment signal lines, whereas the second reference cell array 12 includes (m+1) reference bit lines RBN, and (p+1) adjustment signal lines. Each reference cell array 12 includes a plurality of reference cells 22 disposed at respective intersections between the reference bit lines RB and the adjustment signal lines $\phi_i$ (i=1 to p), and a plurality of fine-adjustment reference cells 23 disposed at intersections between an adjustment signal line $\phi_0$ and the reference bit lines RB.

Each of 2×(n+1)×(m+1) memory cells 21 in each memory cell array 11 includes a single transistor, and a single capacitor for storing data "1" or "0" as a signal charge across the plates thereof. Each of p×(m+1) reference cells 22 includes a single transistor and a single capacitor similar to those in the memory cells 21, and stores data used as a reference data during reading the data from a corresponding memory cell 21.

Each adjustment signal line $\phi_i$ (i=1 to p) is connected to a word-line booster source VPP via a variable resistor $R_\phi$, delivering an adjusted voltage to the gates of cell transistors in the reference cells 24 arranged in the row direction. The cell transistor in each reference cell 24 has an ON-resistance controlled by the adjusted voltage of the corresponding adjustment signal line $\phi_i$. The variable resistor $R_\phi$ is implemented by a plurality of serially-connected combinations of a resistor and a fuse connected in parallel, wherein the resistance of each combination is adjusted by trimming the fuse while using a laser beam.

The fine-adjustment reference cell 23 includes a transistor similar to the cell transistor in each memory cell 21, and a capacitor having a capacitance half the capacitance of the cell capacitor in each memory cell 21, and is used as a correction cell for correcting variations of memory cells caused by fabrication process thereof. The gates of fine-adjustment reference cells are connected to the word-line booster source VPP via the adjustment signal line $\phi_0$ and a fuse, wherein whether the fuse is cut or uncut is determined by whether or not the fine-adjustment reference cell 23 is to be used.

Each sense amplifier array 13 includes (m+1) sense amplifiers 24, and is disposed between two of the memory cell arrays 11 or between the memory cell array 11 and the reference cell array 12. Each sense amplifier 24 in the 2nd to (k−1)-th sense amplifier arrays 13 amplifies the potential difference between the complementary bit lines BLT and BLN disposed in adjacent two of the memory cell arrays 11. In other word, the sense amplifier 24 reads data from a memory cell (first memory cell) in the 2nd to (k−1)-th memory cell array 11 while using as a reference data the data stored in a memory cell (second memory cell) storing data complementary with the data stored in the first memory cell.

Each sense amplifier 24 in the 1st and k-th sense amplifier arrays 13 amplifies the potential difference between the bit line BL of the corresponding memory cell array 11 and the corresponding reference bit line RB of the reference cell array 12. In other word, the sense amplifier 24 reads data from a memory cell 21 in the 1st and k-th memory cell array 11 while using as a reference data the bit-line balancing voltage VHVD precharged on the reference bit line RB.

Figure 2:
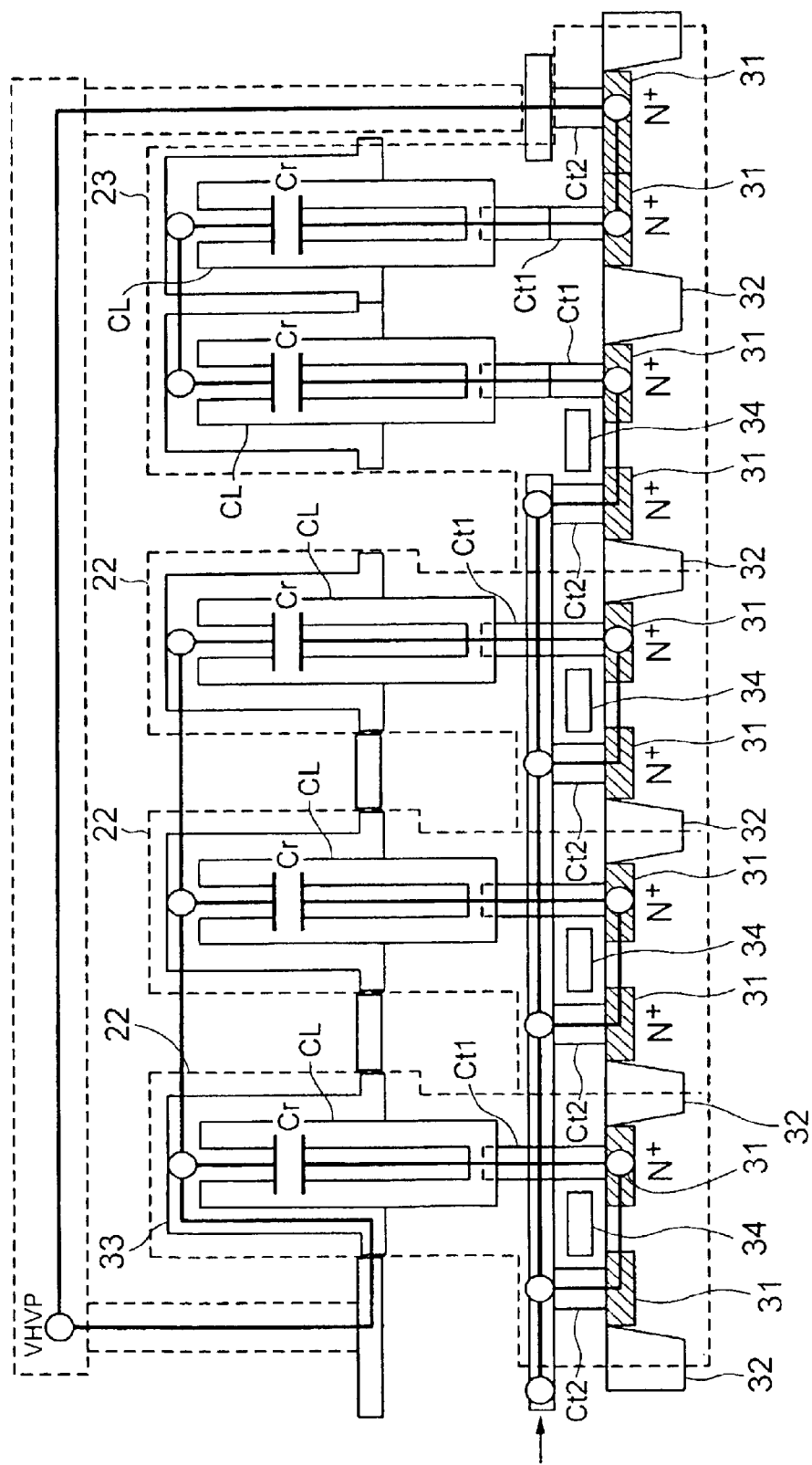
FIG. 2 is a schematic sectional view of the open-bit semiconductor memory device of FIG. 1.

Referring to FIG. 2, there is shown the schematic structure of the reference cell array 12 shown in FIG. 1 in a sectional view taken along the reference bit line RB. Each of the three reference cells 22 connected to the reference bit line RB includes a MOSFET having n⁺-type source/drain diffused regions 31 separated by an isolation oxide film 32 from other source/drain regions 31, and a gate 34 connected to the adjustment signal line $\phi_i$. The drain of MOSFET is connected to the reference bit line RB via a contact Ct2, whereas the source of MOSFET is connected to the bottom plate of the cylindrical capacitor CL (having a capacitance Cr) via a contact Ct1. The top plate 33 of the cylindrical capacitor CL is connected to a power source VHVP.

The fine-adjustment reference cell 23 includes a MOSFET having n⁺-type source/drain regions 31 and a gate, and a pair of cylindrical capacitors CL connected in series between the power source VHVP and the source of MOSFET. The drain of MOSFET is connected to the reference bit line RB via a contact Ct2. The serial connection of the pair of cylindrical capacitors CL allows the capacitance of the fine-adjustment reference cell 23 to be half the capacitance, Cr of the memory cell 21 and the reference cell 22.

Figure 3:
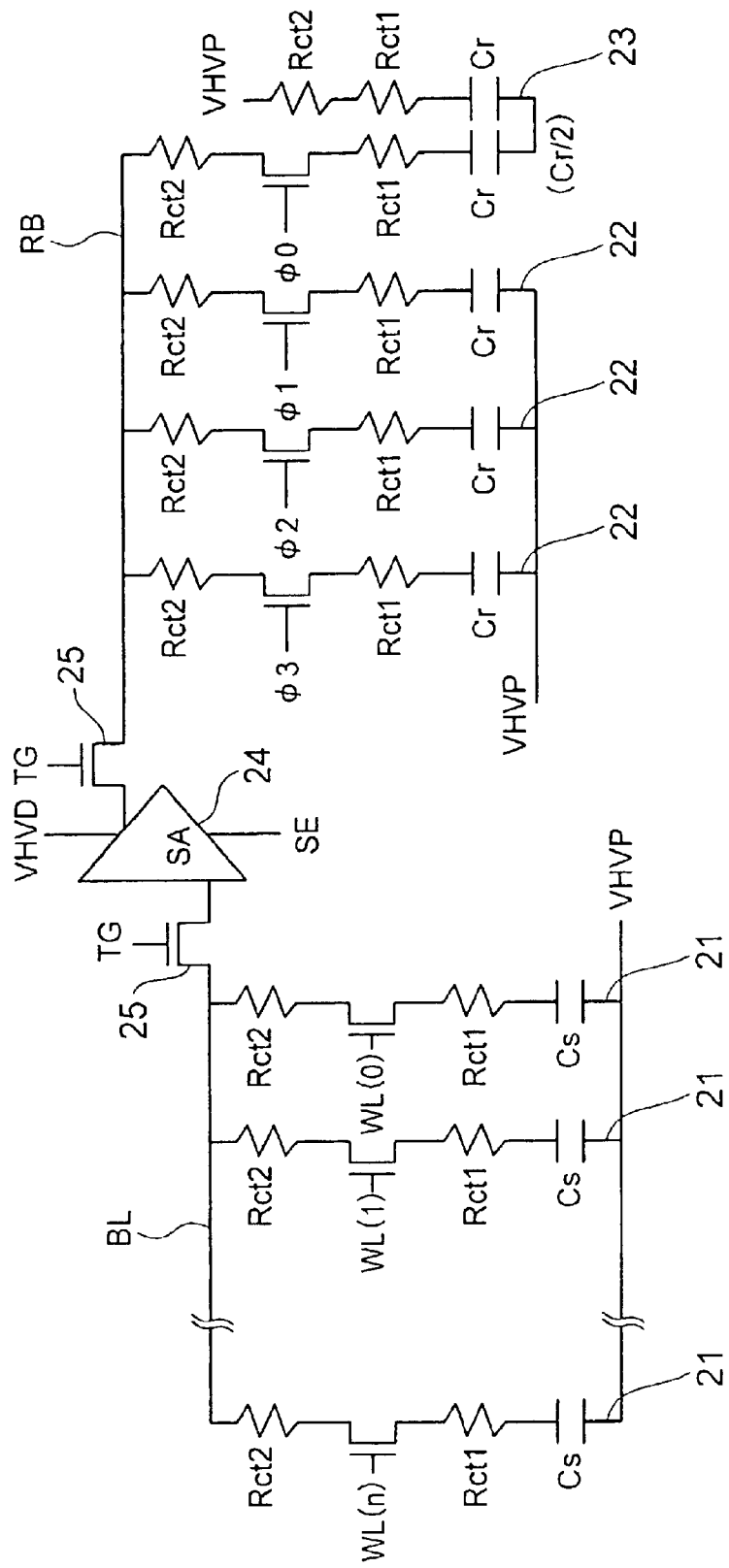
FIG. 3 is an equivalent circuit diagram of the sense amplifier, bit line and reference bit line shown in FIG. 1.

Referring to FIG. 3, there are shown connections between the sense amplifier 24 and bit line BL of the memory cell array 11 and between the sense amplifier 24 and the reference bit line RB of the reference cell array 12. The sense amplifier 24 receives a signal from the bit line BL and the bit-line balancing voltage from the reference bit line RB via transfer gates 25. It is to be noted that Rct1 is the resistance component of the contact Ct1, and Rct2 is the resistance component of the contact Ct2, and that the memory cell 21 in each memory cell array 11 has a structure similar to the structure of the reference cell 22 shown in FIG. 2.

Each sense amplifier 24 receives a sense-amplifier activating signal SE and the bit-line balancing voltage VHVD. The transfer gates 25 are controlled by a transfer control signal TG to control the coupling between the bit line BL and the sense amplifier 24 and between the reference bit line RB and the sense amplifier 24. The (n+1) memory cells 21 arranged in the column direction are connected to the bit line BL in parallel, wherein each memory cell 21 is represented by a MOSFET, resistor Rct2, resistor Rct1 and a capacitor Cs connected in series between the bit line B1 and the power source VHVP.

The p (three in this example) reference cells 22 and a single fine-adjustment reference cell are connected to the reference bit line RB in parallel. The equivalent circuit of the reference cell 22 is similar to that of the memory cell 21 except that gate of MOSFET is connected to the fine-adjustment signal line $\phi_i$ and the bit line BL is replaced by the reference bit line RB in the configuration for the reference cell 22.

Figure 4:
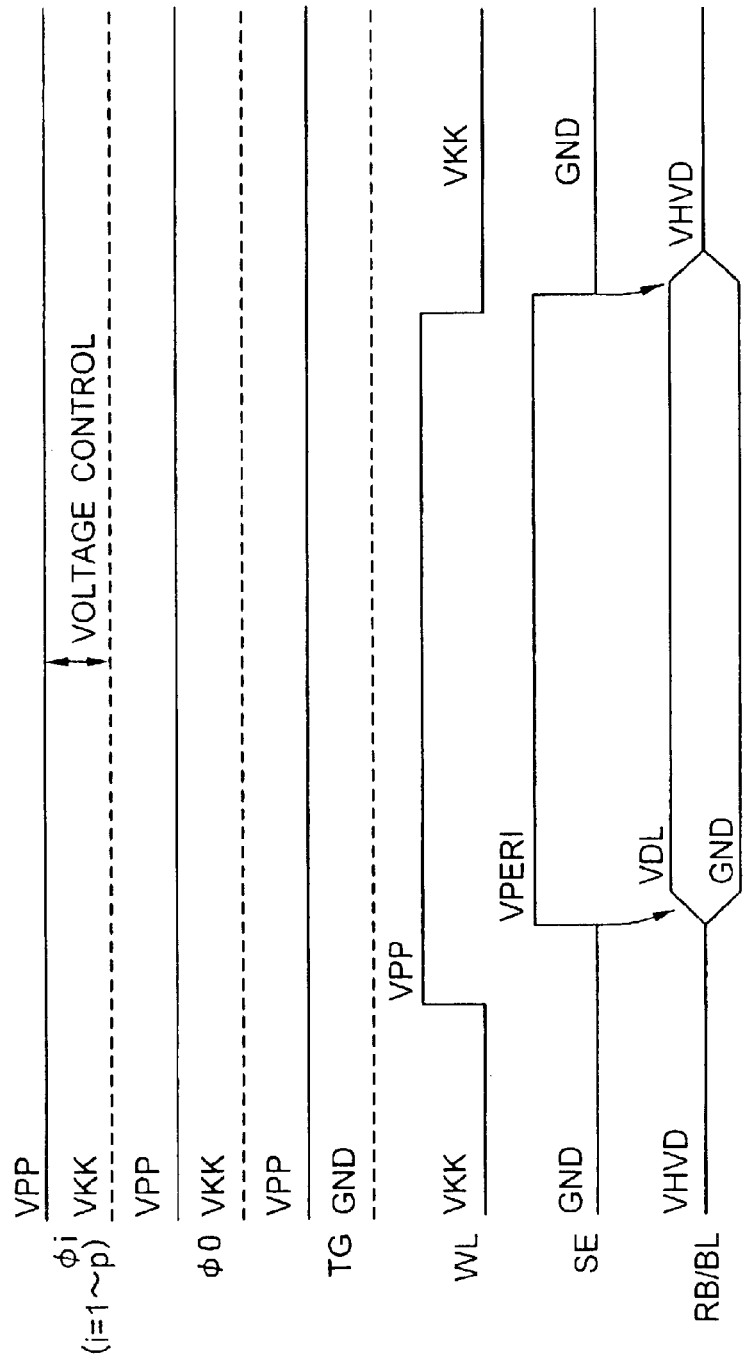
FIG. 4 is a timing chart of the semiconductor memory device of FIG. 1 during a read operation.
Figure 10:
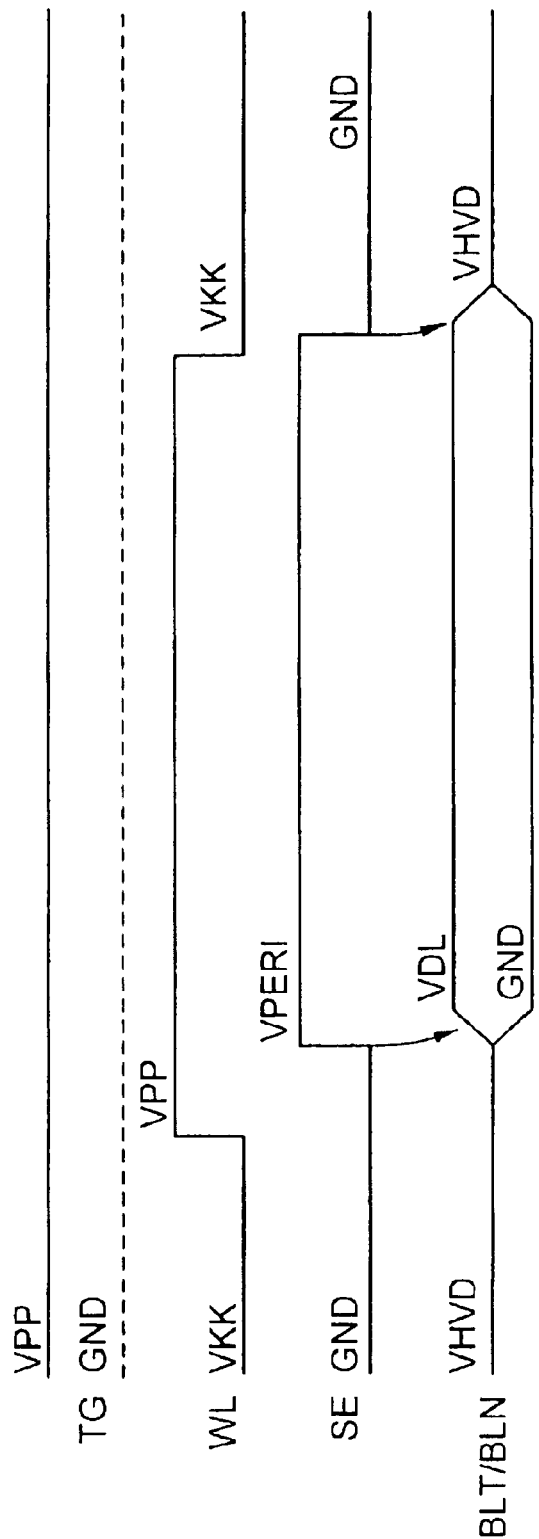
FIG. 10 is a timing chart of the semiconductor memory device of FIG. 9 during a read operation.

Referring to FIG. 4, there is shown a timing chart of the open-bit memory device during a read operation by using a sense amplifier disposed between the memory cell array 11 and the reference cell array 12. It is to be noted that the operation of the sense amplifier 24 disposed between adjacent two of the memory cell arrays 11 in the present embodiment is similar to the operation described in connection with the conventional memory device with reference to the timing chart of FIG. 10.

Upon a read operation, the transfer control signal TG is activated up to the word-line activating voltage VPP. Each adjustment signal line $\phi_i$ (i=1 to p) is supplied with a voltage controlled by a corresponding variable resistor $R_\phi$, whereby the cell transistor of each reference cell 22 couples the reference bit line RB to the capacitor Cr of the reference cell through the ON-resistance corresponding to the controlled voltage of the adjustment signal $\phi_i$ applied to the gate of the cell transistor.

Whether or not the fine-adjustment reference cell 23 is used can be determined by the cut or uncut state of the fuse, as described before. More specifically, if the fuse is left uncut, the adjustment signal line $\phi_0$ is activated up to the voltage of the word-line booster source VPP. In this case, the cell transistor of the fine-adjustment reference cell 23 directly couples the reference bit line and the capacitor (Cr/2) of the fine-adjustment reference cell 23. On the other hand, if the fuse is cut, the cell transistor of the fine-adjustment reference cell 23 is OFF, whereby the capacitor Cr/2 of the fine-adjustment reference cell 23 is separated from the reference bit line, RB.

Before the read operation, the signal levels of the sense-amplifier activating signal SE and the word line WL are a ground level and a VKK level, respectively, whereas the reference bit lines RB and the bit line BL connected to the sense amplifier 24 are equalized for balancing at the voltage of the bit-line balancing voltage VHVD. For facilitating the balancing, the resistance of the variable resistor $R_\phi$ and the cut or uncut state of the fuse for the adjustment signal line $\phi_0$ are selected so as to equalize the line resistance and line capacitance of the bit line BL and the line resistance and line capacitance, respectively, of the reference bit line RB.

When one of the word lines WL is activated in the memory cell array 11, the cell transistors of the memory cells 21 corresponding to the activated word line WL in the memory cell array 21 turn ON, whereby the corresponding cell capacitors are connected to the bit lines BL in the memory cell array 11. Thus, the data stored in the cell capacitors are read onto the respective bit lines BL, whereby the potential of the bit lines BL rise or fall based on the stored data on the respective cell capacitors, with the potential of the reference bit line RB remaining at the bit-line balancing voltage VHVD. The sense amplifiers 24 in the sense amplifier array 13, activated by the sense-amplifier activating signal SE, amplify the potential differences between the bit lines BL and the respective reference bit lines RB.

As a result of the amplification of each of the potential differences, the potentials of the bit line BL and the reference bit line RB assume a high level (voltage of the memory cell array step-down source VDL) and a low level (ground level), respectively, if the data stored in the memory cell 21 is "1", whereas the potentials of the bit line BL and the reference bit line RB assume a low level (ground level) and a high level (voltage of the memory cell array step-down source), respectively, if the data stored in the memory cell is "0". In this stage, the cell capacitors Cs of all the memory cells 21 connected to the activated word line WL receive the data potentials from the respective bit lines BL.

Subsequently, the selected word line WL is inactivated to turn OFF the cell transistors of the memory cells 21 connected to the selected word line WL, whereby the cell capacitors Cs are separated from the respective bit lines BL. Thereafter, the sense-amplifier activating signal SE is inactivated, the sense amplifier 24 stops the operation, and potentials of the reference bit line BL and the reference bit line RB are equalized for balancing at the bit-line balancing voltage VHVD.

In the present embodiment, the line resistance and the line capacitance of the reference bit line RB are adjusted at suitable values by controlling the voltages applied to the gates of the cell transistors of the reference cells 22. In addition, the line resistance and the line capacitance of the reference bit line RB are finely adjusted by a cut or uncut state of the fuse controlling the connection or disconnection of the fine-adjustment reference cell 23 to the reference bit line RB, the fine-adjustment reference cell 23 having a capacitance equal to half the capacitance Cr of the cell capacitor. These configurations allow the number of reference cells 22 in the reference cell array 12 to be reduced down to three, for example, considerably smaller than the number of memory cells 21 in the memory cell array 11 substantially without affecting the suitable amplification of the potential difference by the sense amplifier 24.

In general, the capacitances Cs and Cr and the resistances Rct1 and Rct2 of the memory cell 21 or reference cell 22 vary from device to device due to the process conditions of the fabrication process, which causes variations in the line resistance and the line capacitance of the bit lines BL or reference bit lines RB. In the present embodiment, the line resistances and the line capacitances of the reference bit lines RB can be adjusted after fabrication of the memory device by adjusting the resistances of the variable resistors $R_\phi$.

Figure 5:
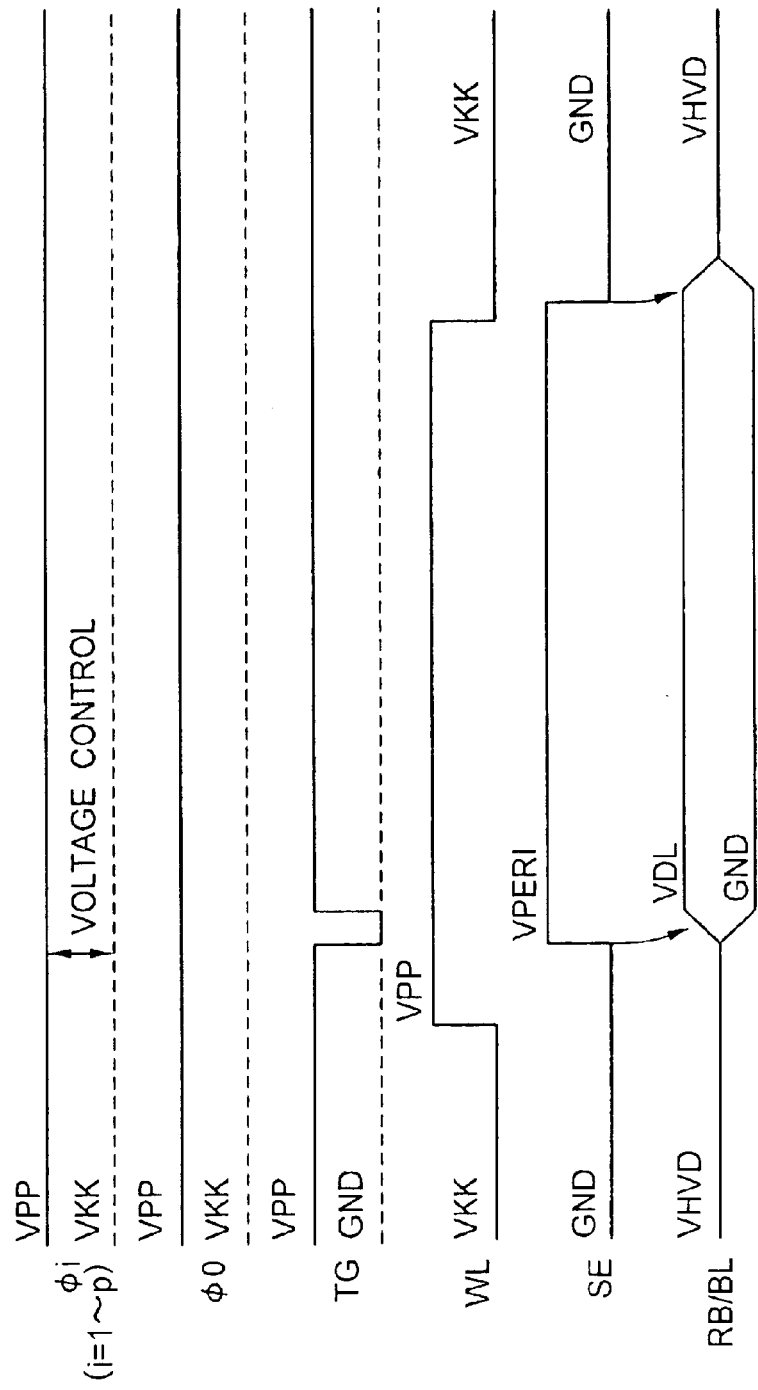
FIG. 5 is a timing chart of an open-bit semiconductor memory device according to a second embodiment of the present invention during a read operation.

Referring to FIG. 5, there is shown a timing chart of a read operation of a semiconductor memory device according to a second embodiment of the present invention. In the present embodiment, the transfer control signal TG is maintained at a low level for a specified short duration at the initial stage of the read operation, and is different from the transfer control signal used in the first embodiment.

Upon the read operation, the transfer control signal TG is inactivated at the timing of activation of the sense-amplifier activating signal SE, and then activated again after a specified time length. The temporary inactivation of the transfer control signal TG breaks the connections between the sense amplifier 24 and the reference bit line RB and between the sense amplifier 24 and the bit line BL. This reduces the resistances and the capacitances as viewed from the sense amplifiers 24, which can operate at a higher speed in the amplification. After the transfer control signal TG is again activated, the amplified signals are delivered to the reference bit line RB and the bit line BL.

In the present embodiment, the temporary inactivation of the transfer control signal TG is also applied to the read operation for each of other memory cells, wherein the sense amplifier 24 disposed between two of the memory cell arrays 11 amplifies the potential difference between the bit lines BLT and BLN.

Figure 6:
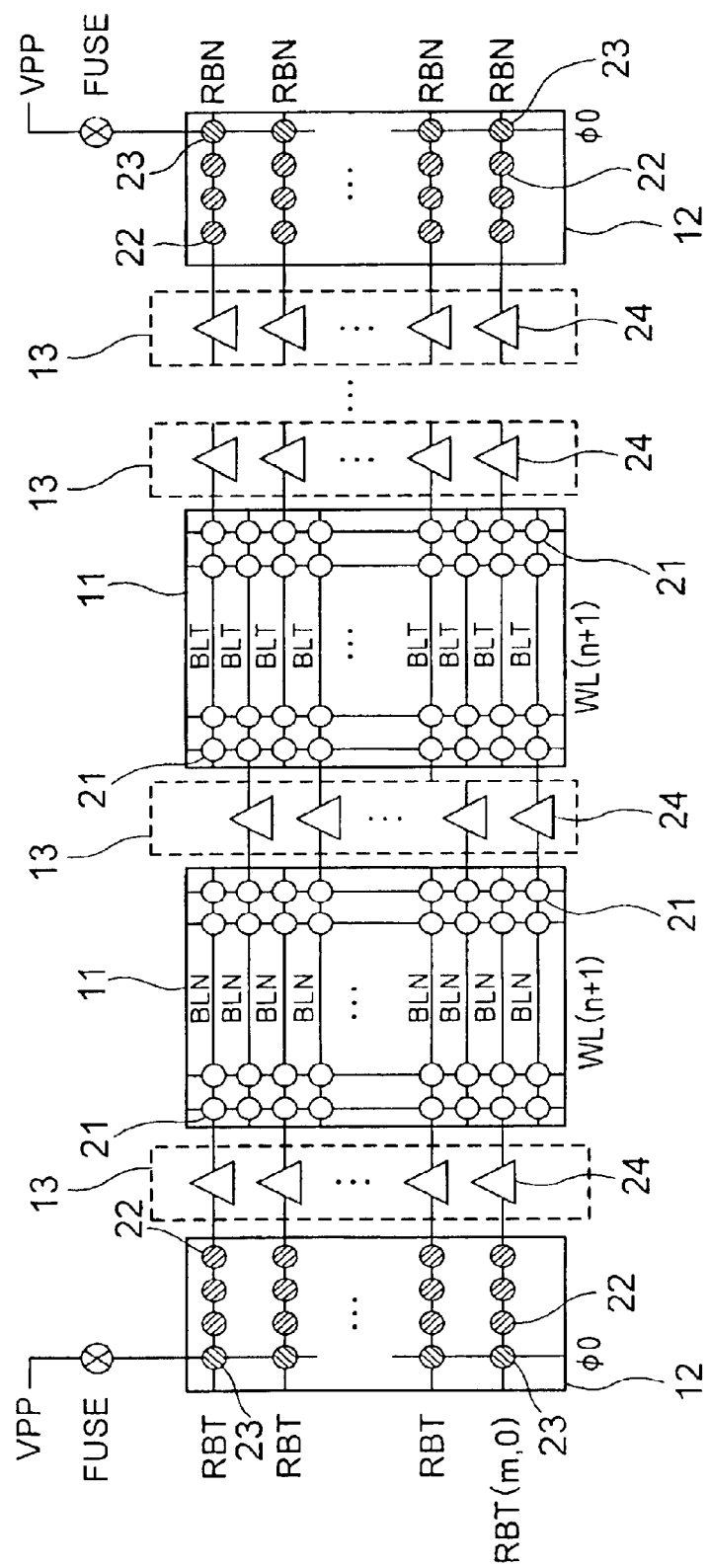
FIG. 6 is a block diagram of an open-bit semiconductor memory device according to a third embodiment of the present invention.

Referring to FIG. 6, an open-bit semiconductor memory device according to a third embodiment of the present invention is similar to the first embodiment except that the reference cell 22 includes no transistor therein and that the reference bit line RB is configured as an impedance line. In this example, three reference cells 22 are connected to a single reference bit line RB.

Figure 7:
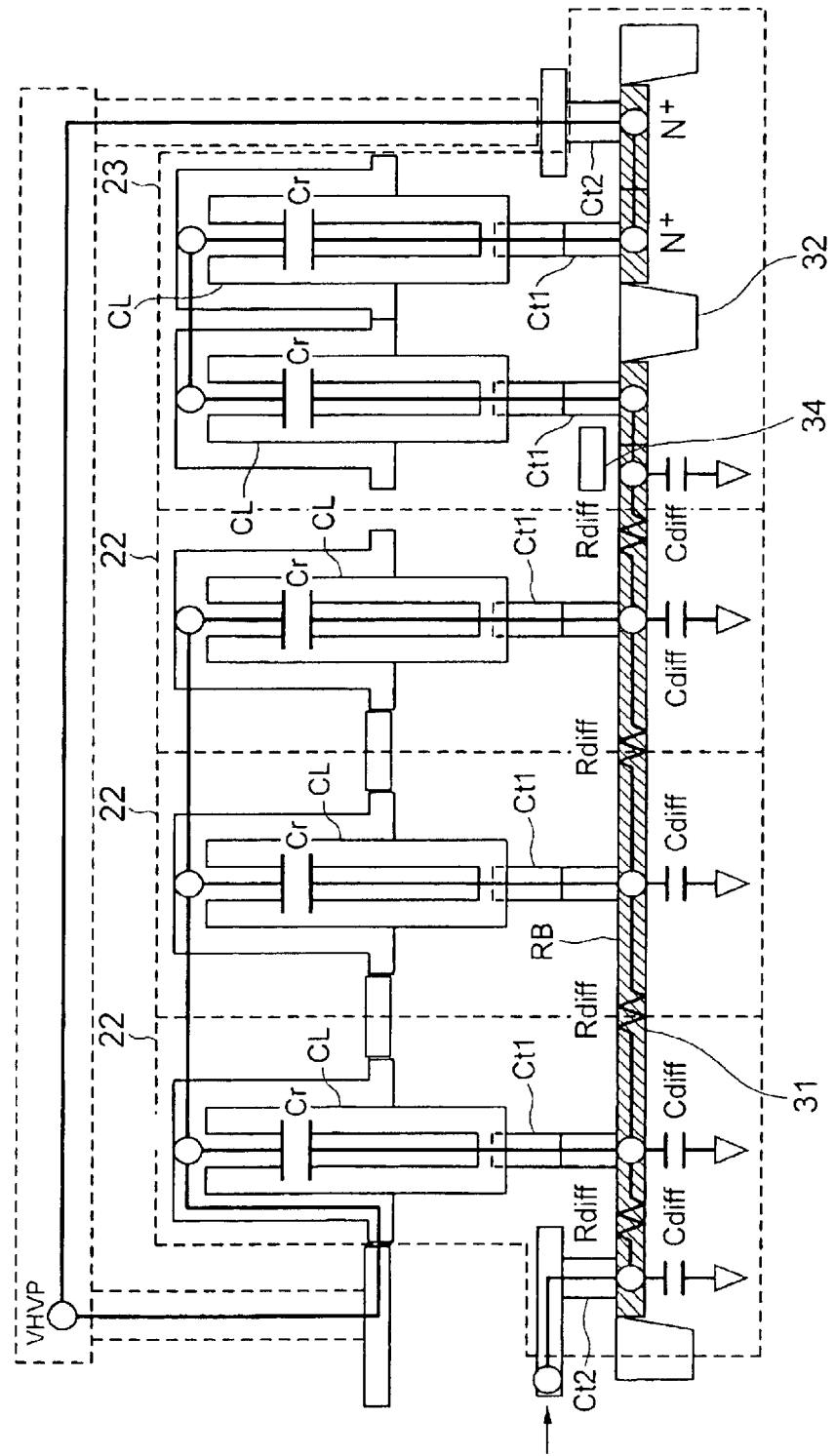
FIG. 7 is a sectional view of the reference cell array shown in FIG. 6.

Referring to FIG. 7, there is shown the structure of the three reference cells and the single fine-adjustment reference cell in FIG. 6, in a sectional view taken along the reference bit line RB. The reference bit line RB is formed by serially-connected n⁺-type diffused regions 31 of the reference cells 22, which have capacitances $C_{diff}$ between the same and the ground for simulating the line capacitance of the bit line BL. The cell capacitor Cr of the reference cell 22 is connected to the reference bit line RB via a contact Ct1.

Figure 8:
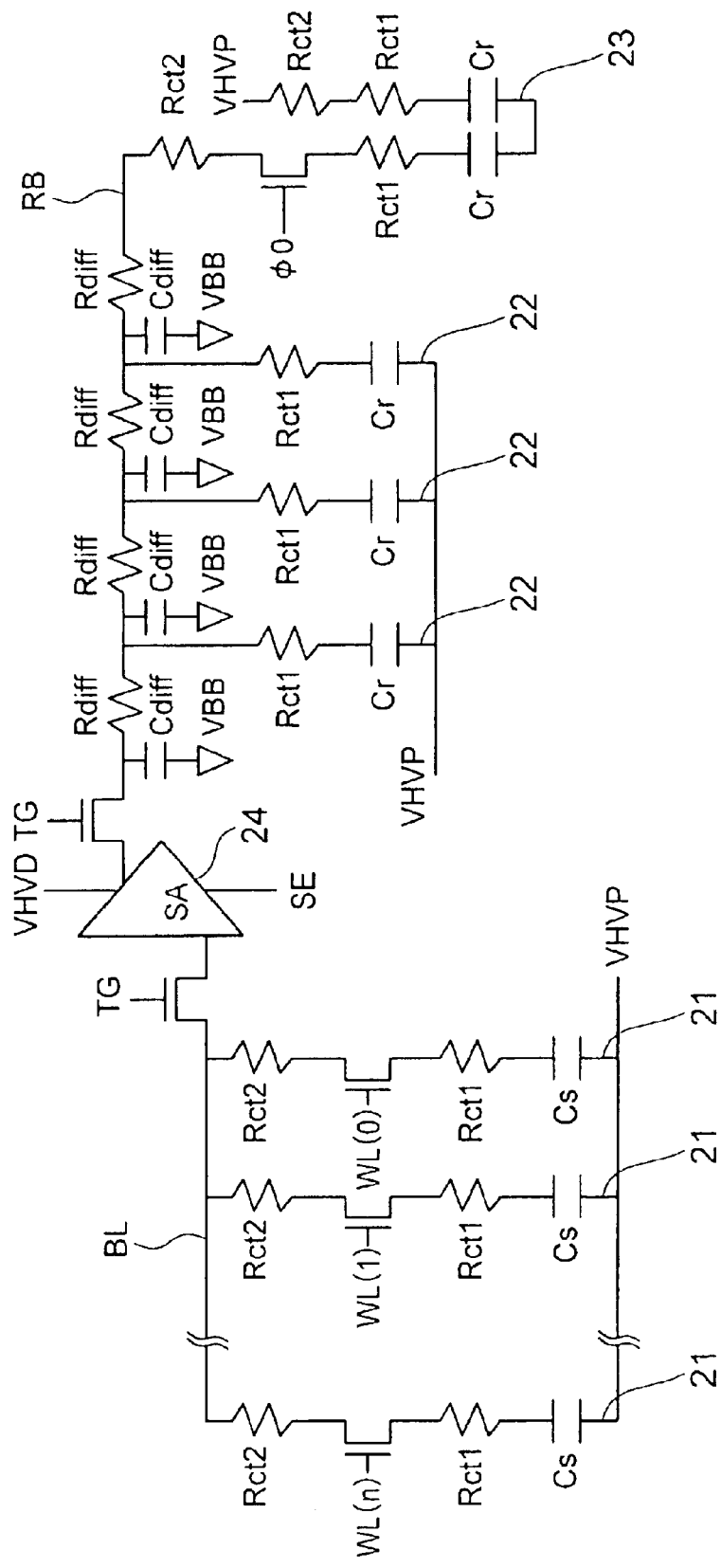
FIG. 8 is an equivalent circuit diagram of the sense amplifier, bit line and reference bit line shown in FIG. 6.
Figure 9:
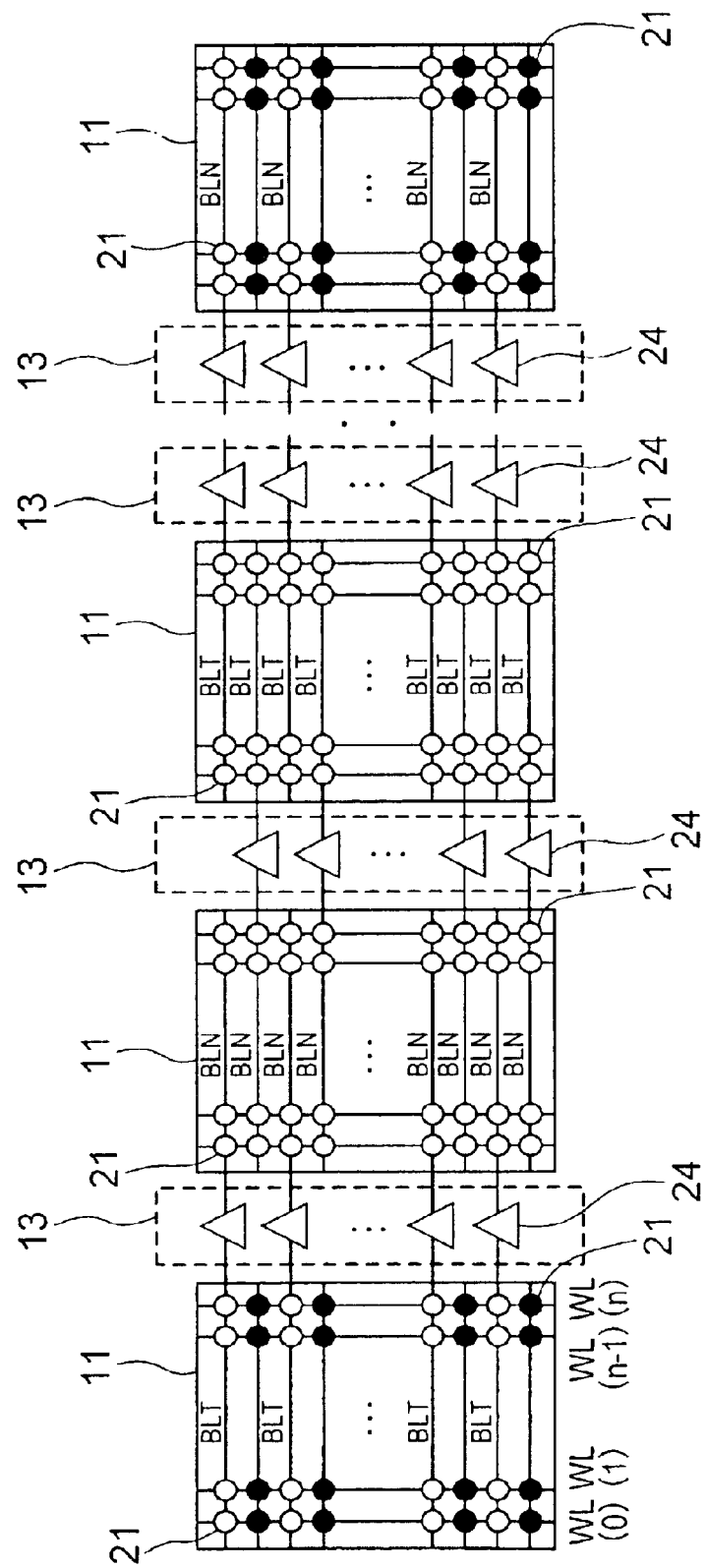
FIG. 9 is a block diagram of a conventional open-bit semiconductor memory device.

Referring to FIG. 8, there is shown an equivalent circuit diagram of the sense amplifier 24, reference bit line RB and bit line BL in FIG. 6. The reference bit line RB includes diffused-region resistances $R_{diff}$ and diffused-region capacitances $C_{diff}$, whereas the reference cell 22 has a resistance Ct1 and a capacitance Cr connected in series between the reference bit line RB and the cell-plate power source VHVP. The top plate of the capacitor Cr is maintained at the substrate potential VBB.

In the present embodiment, the line resistance and the line capacitance of the reference bit line RB can be suitably determined by adjusting the diffused-region resistance $R_{diff}$ of he n⁺-diffused region 31.

In the above embodiments, the fine-adjustment reference cell 23 is connected to the power source VPP via the fuse; however, the fine-adjustment reference cell 23 may be connected to the power source VPP via a variable resistor, similarly to the case of the other adjustment signal lines. In addition, the reference bit line RB may be configured by $n^+$-diffused regions also in the first and second embodiments. Moreover, the capacitance of the fine-adjustment reference cell 23 may be 1/n (n: integer), for example, one-third or quarter of the capacitance Cr of the cell capacitor, because it is sufficient that the capacitance of the fine-adjustment reference cell 23 be smaller than the capacitance Cr of the cell capacitor.

Since the above embodiments are described only for examples, the present invention is not limited to the above embodiments and various modifications or alterations can be easily made therefrom by those skilled in the art without departing from the scope of the present invention.

What is claimed is:

1. A semiconductor memory device comprising:
    a plurality of memory cells;
    a plurality of bit lines each connected to a specified number (n) of said memory cells;
    a plurality of reference bit lines each corresponding to one of said bit lines and connected to a specified number (m) of reference cells, said reference bit lines having a line resistance and a line capacitance equivalent to a line resistance and a line capacitance of a corresponding bit line, where n>m;
    a precharge circuit for supplying a balancing voltage to said bit lines and said reference bit lines; and
    a plurality of sense amplifiers, each for amplifying a potential difference between one of said bit lines and a corresponding reference bit line.

2. The semiconductor memory device according to claim 1, wherein each of said reference cells includes a cell transistor and a cell capacitor equivalent to a cell transistor and a cell capacitor, respectively, of said memory cell, and wherein gates of transistors of said reference cells are applied with a controlled voltage.

3. The semiconductor memory device according to claim 2, wherein said reference cells configure a reference cell array, said reference cell array including a plurality of reference word lines each extending perpendicular to said reference bit lines and applying said controlled voltage to said gates of transistors of said reference cells.

4. The semiconductor memory device according to claim 1, wherein at least a part of said reference bit line is configured by a diffused region.

5. The semiconductor memory device according to claim 4, wherein said reference cell includes a cell capacitor having a capacitance equivalent to a capacitance of a cell capacitor of said memory cell.

6. A semiconductor memory device comprising:
    a plurality of memory cells;
    a plurality of bit lines each connected to a specified number (n) of said memory cells;
    a plurality of reference bit lines each corresponding to one of said bit lines and connected to a specified number (m) of reference cells, said reference bit lines having have a line resistance and a line capacitance equivalent to a line resistance and a line capacitance, respectively, of a corresponding bit line, where n>m;
    a precharge circuit for supplying a balancing voltage to said bit lines and said reference bit lines; and
    a plurality of sense amplifiers, each for amplifying a potential difference between one of said bit lines and a corresponding reference bit line, and
    wherein said reference bit line is further connected to a fine-adjustment reference cell including a cell capacitor, said cell capacitor having a capacitance smaller than a capacitance of a cell capacitor of said memory cell.

7. The semiconductor memory device according to claim 6, wherein said cell capacitor of said fine-adjustment reference cell has a capacitance equal to half a capacitance of said cell capacitor of said memory cell.

8. A semiconductor memory device comprising:
    a plurality of first memory cell arrays each including a plurality of first memory cells arranged in a matrix, a plurality of first bit lines each extending in a column direction and connected to a column of said first memory cells, and a plurality of first word lines each extending in a row direction and connected to said first memory cells;
    a plurality of second memory cell arrays arranged alternately with said first memory cell arrays in said column direction, each of said second memory cell arrays including second memory cells arranged in a matrix in number corresponding to a number of said first memory cells, a plurality of second bit lines each extending in said column direction and connected to a column of said second memory cells, a plurality of second word lines each extending in said row direction and connected to said second memory cells, half of said first memory cells in one of said first memory cell arrays and a corresponding half of said second memory cells in an adjacent one of said second memory cell arrays storing therein complementary data;
    at least one reference cell array disposed outside said first and second memory cell arrays and including a plurality of reference bit lines corresponding to either said first bit lines or second bit lines, each of said reference bit lines being connected to a specified number of reference cells, said specified number being smaller than a number of said memory cells arranged in said column of said first or second memory cells;
    a precharge circuit for supplying a balancing voltage to said first or second bit lines and corresponding said reference bit lines; and
    a plurality of sense amplifier arrays each disposed between one of said first memory cell arrays and a corresponding one of said second memory cell arrays, or between one of said first and second memory cell arrays and said reference cell array, each of said sense amplifier arrays including sense amplifiers in number corresponding to half said number of said first bit lines in one of said first memory cell arrays, each of said sense amplifiers amplifying a potential difference between one of said first bit lines and a corresponding one of said second bit lines having complementary data thereon or between one of said first and second bit lines and one of said reference bit lines.

9. The semiconductor memory device according to claim 8, wherein each of said reference cells includes a cell transistor and a cell capacitor equivalent to a cell transistor and a cell capacitor, respectively, of each of said memory cells, and wherein gates of transistors of said reference cells are applied with a controlled voltage.

10. The semiconductor memory device according to claim 8, wherein at least a part of said reference bit line is configured by a diffused region.

11. The semiconductor memory device according to claim 10, wherein said reference cell includes a cell capacitor having a capacitance equivalent to a capacitance of a cell capacitor of each of said memory cells.

12. A semiconductor memory device comprising:

a plurality of first memory cell arrays each including a plurality of first memory cells arranged in a matrix, a plurality of first bit lines each extending in a column direction and connected to a column of said first memory cells, and a plurality of first word lines each extending in a row direction and connected to said first memory cells;

a plurality of second memory cell arrays arranged alternately with said first memory cell arrays in said column direction, each of said second memory cell arrays including second memory cells arranged in a matrix in number corresponding to a number of said first memory cells, a plurality of second bit lines each extending in said column direction and connected to a column of said second memory cells, a plurality of second word lines each extending in said row direction and connected to said second memory cells, half of said first memory cells in one of said first memory cell arrays and a corresponding half of said second memory cells in an adjacent one of said second memory cell arrays storing therein complementary data;

at least one reference cell array disposed outside said first and second memory cell arrays and including a plurality of reference bit lines corresponding to either said first bit lines or second bit lines, each of said reference bit lines being connected to a specified number of reference cells, said specified number being smaller than a number of said memory cells arranged in said column of said first or second memory cells;

a precharge circuit for supplying a balancing voltage to said first or second bit lines and corresponding said reference bit lines; and a plurality of sense amplifier arrays each disposed between one of said first memory cell arrays and a corresponding one of said second memory cell arrays, or between one of said first and second memory cell arrays and said reference cell array, each of said sense amplifier arrays including sense amplifiers in number corresponding to half said number of said first bit lines in one of said first memory cell arrays, each of said sense amplifiers amplifying a potential difference between one of said first bit lines and a corresponding one of said second bit lines having complementary data thereon or between one of said first and second bit lines and one of said reference bit lines, wherein said reference bit line is further connected to a fine-adjustment reference cell including a cell capacitor, said cell capacitor having a capacitance smaller than a capacitance of a cell capacitor of each of said memory cells.

13. The semiconductor memory device according to claim 12, wherein said cell capacitor of said fine-adjustment reference cell has a capacitance equal to half a capacitance of said cell capacitor of each of said memory cells.

* * * * *